(12) United States Patent
Abts et al.

(10) Patent No.: US 8,407,167 B1
(45) Date of Patent: Mar. 26, 2013

(54) METHOD FOR OPTIMIZING MEMORY CONTROLLER CONFIGURATION IN MULTI-CORE PROCESSORS USING FITNESS METRICS AND CHANNEL LOADS

(75) Inventors: Dennis C. Abts, Eleva, WI (US); Daniel Gibson, Madison, WI (US)

(73) Assignee: Google Inc., Mountain View, CA (US)

( * ) Notice: Subject to any disclaimer, the term of this patent is extended or adjusted under 35 U.S.C. 154(b) by 950 days.

(21) Appl. No.: 12/487,957

(22) Filed: Jun. 19, 2009

(51) Int. Cl.
*G06F 15/18* (2006.01)
(52) U.S. Cl. ......................................................... 706/13
(58) Field of Classification Search .................... 706/12, 706/13, 45, 62
See application file for complete search history.

(56) References Cited

U.S. PATENT DOCUMENTS

2008/0151909 A1   6/2008   Scott et al.

OTHER PUBLICATIONS

Wentzlaff et al., On-Chip Interconnection Architecture of the Tile Processor, IEEE, Sep.-Oct. 2007, pp. 15-31.
Bjerregaard et al., A Survey of Research and Practices of Network-on-Chip, ACM Computing Surveys, vol. 38, Mar. 2006, Article 1, pp. 51.
Dally et al., Deadlock-Free Adaptive Routing in Multicomputer Networks Using Virtual Channels, IEEE Transactions and Distributed Systems, vol. 4, No. 4, Apr. 1993, p. 466-475.
Dally, Virtual Channel Flow Control, IEEE, 1990, pp. 60-68.
Dally, Virtual-Channel Flow Control, IEEE Transactions on Parallel and Distributed Systems, vol. 3, No. 2, Mar. 1992, pp. 194-205.
Jayasimha D.N. et al., A Foundation for Designing Deadlock-Free Routing Algorithms in Wormhole Networks, Journal of the ACM, vol. 50, No. 2, Mar. 2003, pp. 250-275.
Mohapatra, Wormhole Routing Techniques for Directly Connected Multicomputer Systems, ACM Computing Surveys, vol. 30, No. 3, Sep. 1998, pp. 374-410.
Mukherjee et al., A Comparative Study of Arbitration Algorithms for the Alpha 21364 Pipelined Router, Oct. 2002, pp. 223-234.
Vangal et al., An 80 Tile 1.28TFLOPS Network-on-Chip in 65nm CMOS, 2007 IEEE International Solid-State Circuits Conference, ISSCC 2007/Session 5/Microprocessors/5.2, pp. 98-99, and p. 589.
Ramanathan et al., Survey of Commercial Parallel Machines, ACM Sigarch Computer Architecture News, vol. 21, Issue 3, Jun. 1993, pp. 13-33.
Seo et al., Near-Optimal Worst-case Throughput Routing for Two-Dimensional Mesh Networks, Proceedings of the 32nd International Symposium on Computer Architecture (ISCA '05), IEEE, 2005, pp. 12.

*Primary Examiner* — David Vincent
(74) *Attorney, Agent, or Firm* — Lerner, David, Littenberg, Krumholz & Mentlik, LLP

(57) ABSTRACT

The location of the memory controllers within the on-chip fabric of multiprocessor architectures plays a central role in latency bandwidth characteristics of the processor-to-memory traffic. Intelligent placement substantially reduces the maximum channel load depending on the specific memory controller configuration selected. A variety of simulation techniques are used along and in combination to determine optimal memory controller arrangements. Diamond-type and diagonal X-type memory controller configurations that spread network traffic across all rows and columns in a multiprocessor array substantially improve over other arrangements. Such placements reduce interconnect latency by an average of 10% for real workloads, and the small number of memory controllers relative to the number of on-chip cores opens up a rich design space to optimize latency and bandwidth characteristics of the on-chip network.

10 Claims, 20 Drawing Sheets

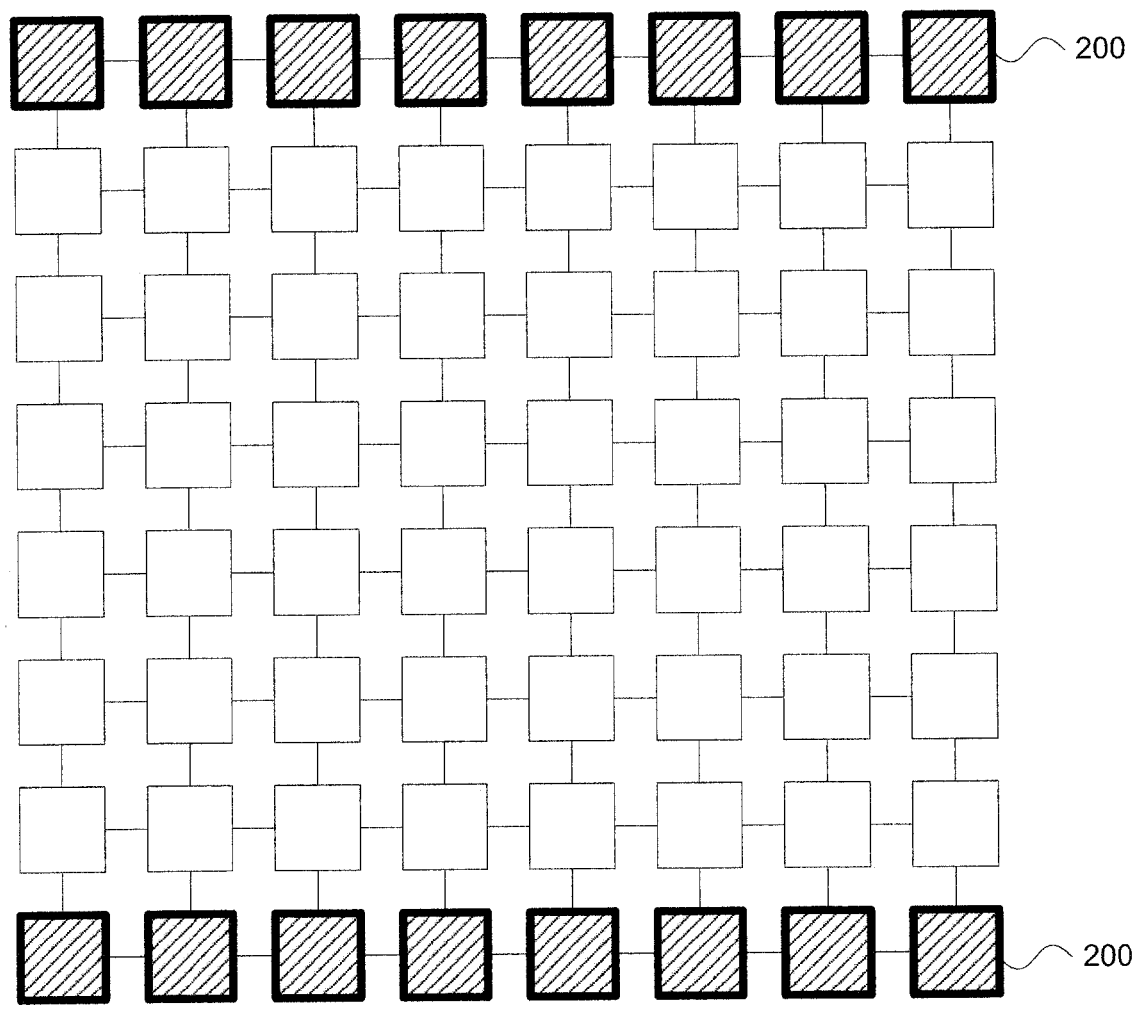

FIG. 4

Table 1. Simulation parameters.

| Parameters | Values |
|---|---|
| processors | 64 |
| memory controllers | 16 |
| router latency | 1 cycle |
| inter-router wire latency | 1 cycle |
| buffers | 32 flits per input divided among the VCs |
| packet size | 1 flit for request<br>4 flit for reply |
| virtual channels | 2 for XY, YX, CDR<br>4 for XY-YX |

Table 2. Benchmark descriptions.

| Benchmark | Description |
|---|---|
| TPC-H | TPC's Decision Support System Benchmark, IBM DB2 v6.1 running query 12 w/ 512MB database, 1GB of memory |
| SPECjbb | Standard java server workload utilizing 24 warehouses, executing 200 requests |
| TPC-W | TPC's Web e-Commerce Benchmark, DB Tier Browsing mix, 40 web transactions |
| SPECweb | Zeus Web Server 3.3.7 servicing 300 HTTP requests |

Table 3. Full system simulation configuration.

| Parameters | Values |
|---|---|
| Processors | 64 in-order cores |
| L1 I& D caches | 16KB (2 way set associative) 1 cycle latency |
| L2 (Private) | 64 KB (4 way set associative) 6 cycle latency |
| L3 (Shared) | 8 MB (16 way set associative) |
| Memory Latency | 150 cycles |
| Network Parameters | See Table 1 |

| Memory Controller Configuration | | Max. Channel Load | |
|---|---|---|---|
| | | Mesh | Torus |
| row0_7 | FIG. 2A | 13.50 | 9.25 |
| col0_7 | FIG. 2B | 13.50 | 9.25 |
| row2_5 | FIG. 5A | 13.49 | 9.22 |
| diagonal X | FIG. 5C | 8.93 | 7.72 |
| diamond | FIG. 5D | 8.90 | 7.72 |
| checkerboard | FIG. 5B | 10.24 | 7.69 |

FIG. 6

(b) row0_7 reply only (a) row0_7 req only (d) diamond req only (c) row0_7 req+reply

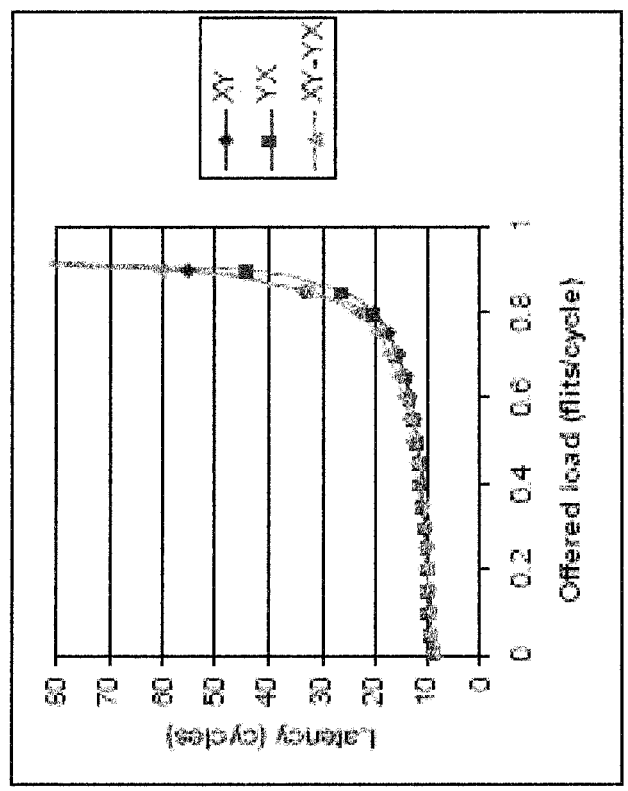

(a) row0_7 uniform random (b) diamond uniform random (c) row0_7 hotspot (d) diamond hotspot

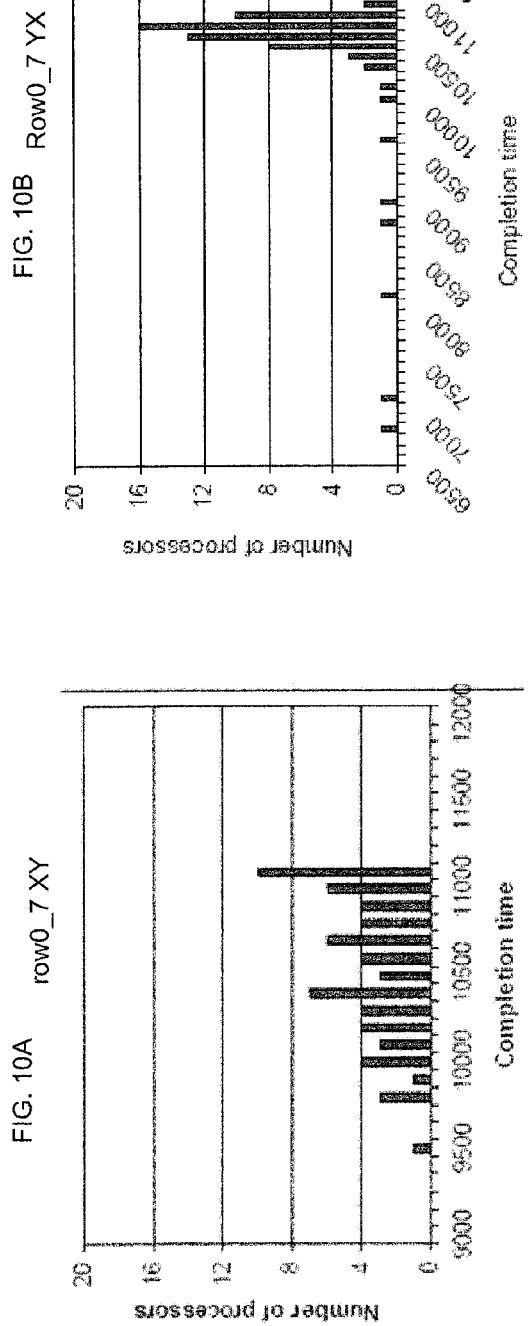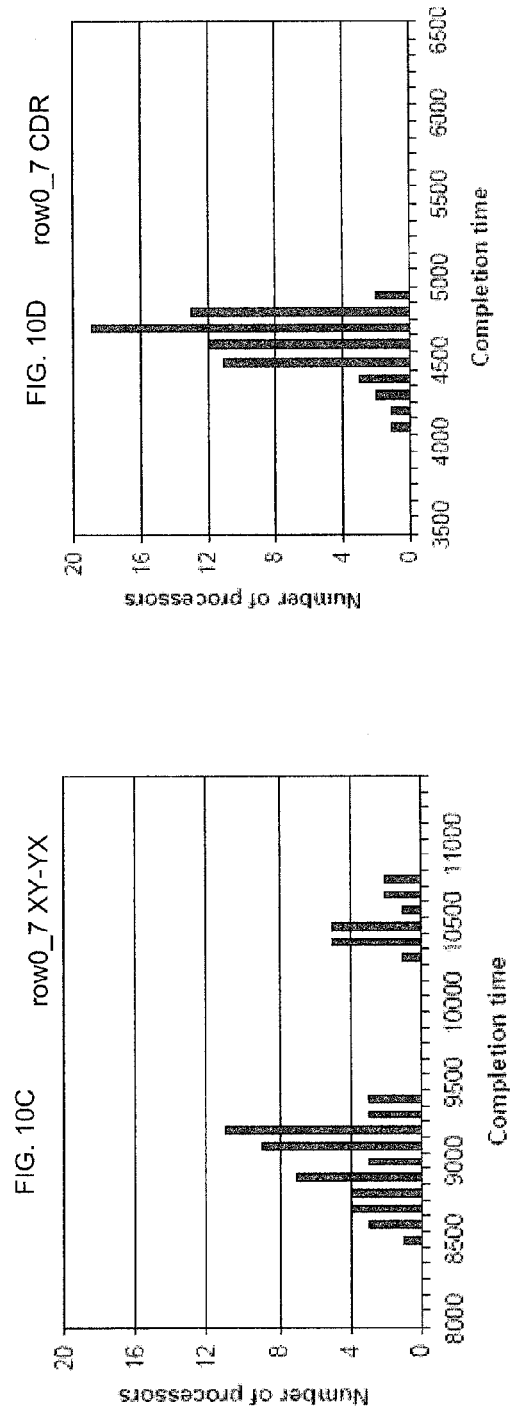

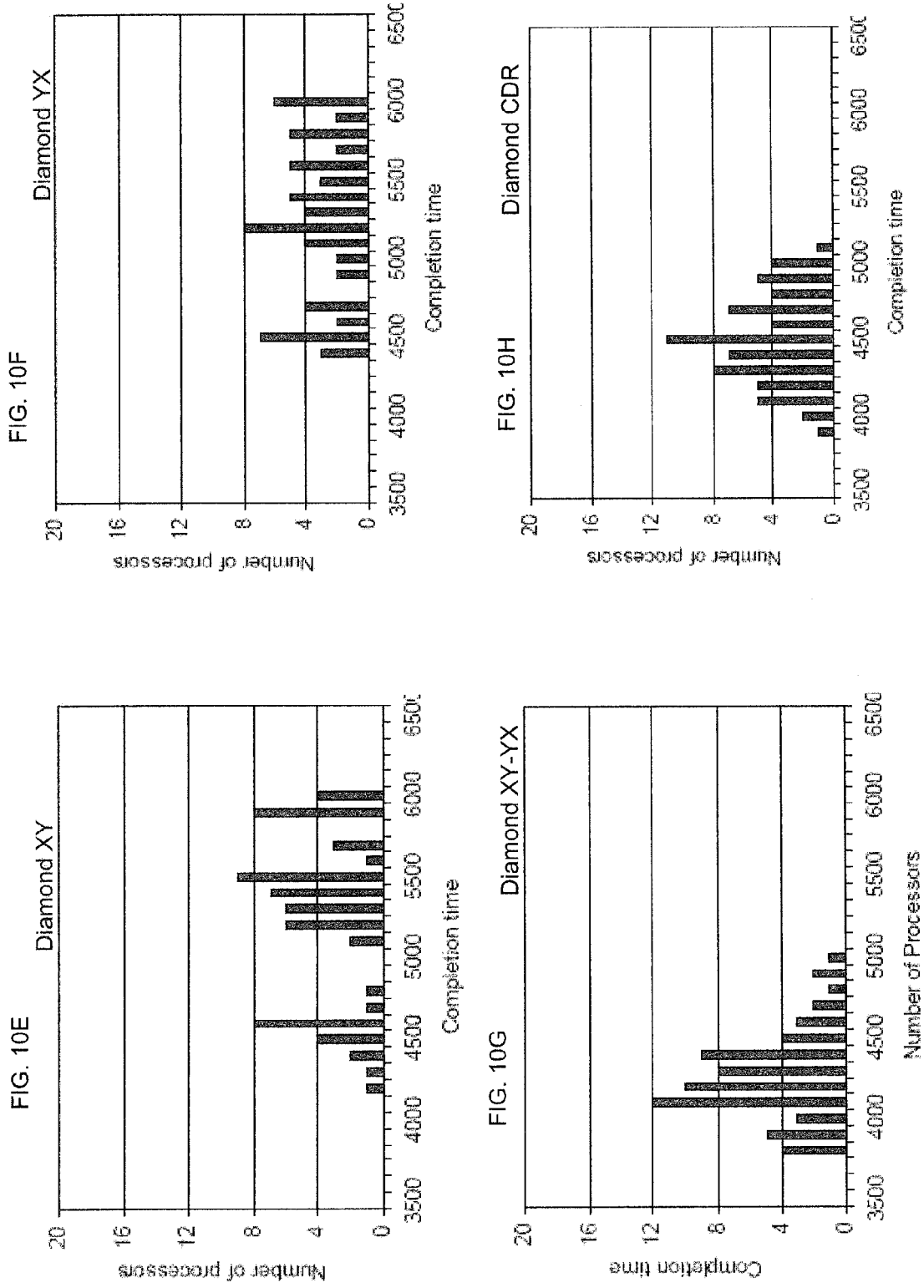

METHOD FOR OPTIMIZING MEMORY CONTROLLER CONFIGURATION IN MULTI-CORE PROCESSORS USING FITNESS METRICS AND CHANNEL LOADS

BACKGROUND OF THE INVENTION

1. Field of the Invention

Aspects of the invention relate generally to multiprocessor computer architectures. More particularly, aspects are directed to memory controller configurations for routing data between processors and memory.

2. Description of Related Art

In many computer systems, such as high speed data processing systems, multiple processors are employed. The processors may be arranged in different configurations. For instance, an array of processors may be configured in a mesh or torus architecture. These processors may be interconnected and have access to external memory through one or more memory controllers.

As multiprocessor computer architectures become more and more complex, it becomes increasingly difficult to determine optimal placement of memory controllers in relation to the processors. Improper placement of memory controllers can cause unwanted delays (latency) or other processing issues. Therefore, it is important to properly evaluate multiprocessor architectures and determine effective placement of the memory controllers.

Systems and methods that optimize memory controller placement relative to the processors, thereby improving memory utilization and reducing latency, are provided.

SUMMARY OF THE INVENTION

In one embodiment of the invention, a multiprocessor architecture comprises a plurality of processors arranged in an array and a plurality of memory controllers. Each processor is positioned at a node of the array configured to route message packets across the array. The plurality of memory controllers is operatively coupled to the processors in the array. Each memory controller is directly connected to a respective one of the plurality of processors and coupled to an external memory. The plurality of memory controllers is configured to receive message packets comprising memory requests from the processors in the array and to issue replies based upon the memory requests. Each memory controller is directly connected to the respective processor so that each row in the array has at least one of its processors directly connected to the respective memory controller. And each column in the array has at least one of its processors directly connected to the respective memory controller to spread memory request and reply traffic across all of the rows and columns in the array.

In one alternative, the array includes at least six rows and at least six columns. In another alternative, the array comprises a mesh architecture. In a further alternative, the array comprises a torus architecture. In yet another alternative, the plurality of memory controllers are directly connected to the respective processors in a diagonal X configuration. And in another alternative, each processor that is directly connected to one of the plurality of memory controllers is situated diagonally adjacent to another processor in the array that is also directly connected to one of the plurality of memory controllers.

In another embodiment, a multiprocessor architecture comprises a plurality of processors arranged in an array, a plurality of multiport router switches, and a plurality of memory controllers. Each processor resides at a node of the array. Each router switch is coupled to one of the nodes in the array and is configured to route message packets across the array by directing the message packets to an adjacent node in the array. And the plurality of memory controllers is operatively coupled to the processors in the array. Each memory controller is directly connected to a respective one of the plurality of processors and coupled to an external memory. The plurality of memory controllers is configured to receive message packets comprising memory requests from the processors in the array and to issue replies based upon the memory requests. Each memory controller is directly connected to the respective processor so that the plurality of memory controllers are arranged in a diagonal X configuration.

In another embodiment, a method of selecting a memory controller configuration for an N×M multiprocessor array comprises initializing a population including multiple memory controller configurations, each memory controller configuration including a plurality of memory controllers for coupling to selected processors in the multiprocessor array; representing each memory controller configuration solution by a bit vector of N*M Boolean elements; evaluating a fitness metric for the bit vector of each memory controller configuration, the fitness metric identifying at least one of a maximum channel load and a contention rate for each given configuration; determining whether stagnation has occurred in the population; and if stagnation has occurred, reporting a subset of the population based upon the fitness metric.

In one example, if stagnation has not occurred, the method further comprises selecting k solutions from the population having the lowest fitness metric; and merging the k solutions to form a new set of solutions. In one alternative, this method further comprises determining whether a maximum number of generations has been reached; if the maximum number of generations has been reached, reporting the subset of the population remaining in the merged solutions; and if the maximum number of generations has not been reached, mutating the new set of solutions to produce mutated solutions. In one example, mutating the new set of solutions includes swapping adjacent bits in the bit vector. In this case, mutating the new set of solutions may further include replacing existing ones of the new set of solutions with the mutated solutions. Alternatively, the method further comprises re-evaluating the fitness metric for each memory controller configuration remaining in the merged solutions after mutation.

In another example, the fitness metric is derived from a contention simulation, and the method further comprises simulating random permutation traffic for each memory controller configuration in the population. And in yet another example, each bit vector is evaluated no more than once.

A further embodiment of the invention includes a method of selecting a memory controller configuration for a multiprocessor array. The method comprises identifying a plurality of memory controller configurations of the multiprocessor array for testing; executing a link contention simulation trial on a first one of the memory controller configurations to trace a path that a memory packet takes through nodes in the multiprocessor array; incrementing a count on each link that the memory packet traverses, the count representing a channel load of the first memory controller configuration; repeating the link contention simulation trial until a maximum number of trials has been reached for the first memory controller configuration; averaging the channel loads for all trials to obtain a fitness metric for the first memory controller configuration; performing the executing, incrementing, repeating and averaging for each remaining memory controller configuration; and selecting a given one of the memory controller configurations having the lowest fitness metric.

The method may further comprise evaluating a subset of the memory controller configurations by representing each one of the subset of memory controller configurations by a bit vector of N*M Boolean elements; evaluating a fitness metric for each one of the subset of memory controller configurations, the fitness metric identifying at least one of a maximum channel load and a contention rate for each given configuration; and selecting one configuration from the subset of memory controller configurations based upon the fitness metric.

BRIEF DESCRIPTION OF THE DRAWINGS

FIGS. 2A-B illustrate a pair of exemplary memory controller arrangements.

FIG. 4 provide a series of tables identifying simulation parameters and related information in accordance with aspects of the invention.

FIG. 6 is a chart comparing memory controller configurations in accordance with aspects of the invention.

FIGS. 8A-F illustrate distribution plots for memory controller configurations in accordance with aspects of the invention.

FIGS. 10A-H illustrate additional distribution plots for memory controller configurations in accordance with aspects of the invention.

DETAILED DESCRIPTION

Aspects, features and advantages of the invention will be appreciated when considered with reference to the following description of preferred embodiments and accompanying figures. The same reference numbers in different drawings may identify the same or similar elements. Furthermore, the following description is not limiting; the scope of the invention is defined by the appended claims and equivalents.

Figure 1:
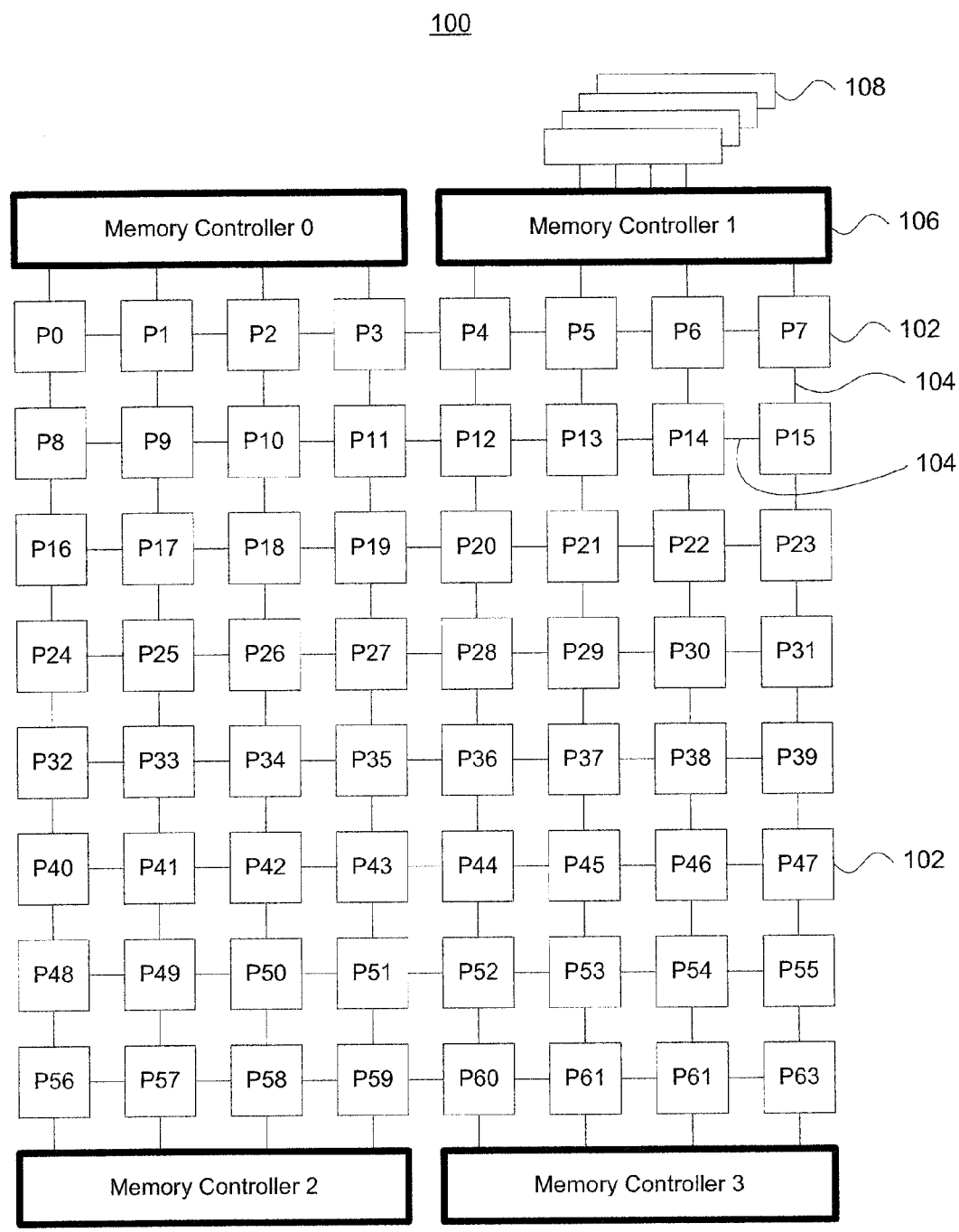
FIG. 1 illustrates a multiprocessor architecture for use in accordance with aspects of the invention.

FIG. 1 illustrates an exemplary multiprocessor computer architecture 100. As shown, the architecture includes 64 processors (P0 . . . P63) arranged in a mesh-type configuration at nodes 102. The processors at adjacent nodes 102 in the mesh are directly linked to one another via connections 104. For instance, processor P9 is connected to processors P1, P8, P10 and P17.

The processors along the top (P0 . . . P7) and bottom (P56 . . . P63) nodes of the mesh may be directly linked to respective memory controllers 106. As shown in this example, four processors 102 connect to each memory controller 106. In addition, each memory controller 106 couples to a physical memory 108. The remaining processors may communicate with the memory controllers 106 through one or more intervening nodes 102.

Flip-chip packaging allows sufficient escape paths from anywhere on a chip. This leaves open the question of where to place each memory controller within the on-chip network to minimize both latency and link contention. The memory controllers themselves do not have to be part of the on-chip network. Rather, the ingress/egress ports to/from the memory are part of the on-chip network. The combination of where the memory controllers are located and routing algorithm may significantly influence how much traffic each link will carry.

As the number of processor cores (individual processors in the array) grows, it becomes impractical for each processor to have a memory controller directly attached. Furthermore, a many-core chip multiprocessor with n processors and m memory ports will have $$\binom{n}{m}$$

possible permutations for where the memory controllers may be located within the on-chip fabric. These different memory controller configurations can have a dramatic impact on the latency and bandwidth characteristics of the on-chip network, especially for a mesh topology which is not edge symmetric like a torus, for example. Furthermore, by reducing the variance in packet latency as well as channel load, the on-chip network is less sensitive to which processor core (individual processor) a thread is scheduled for execution on. In accordance with aspects of the invention, careful placement of the memory controllers improves performance and provide predictable latency-bandwidth characteristics regardless of where a thread executes on the array of the chip multiprocessor.

Figure 2B:
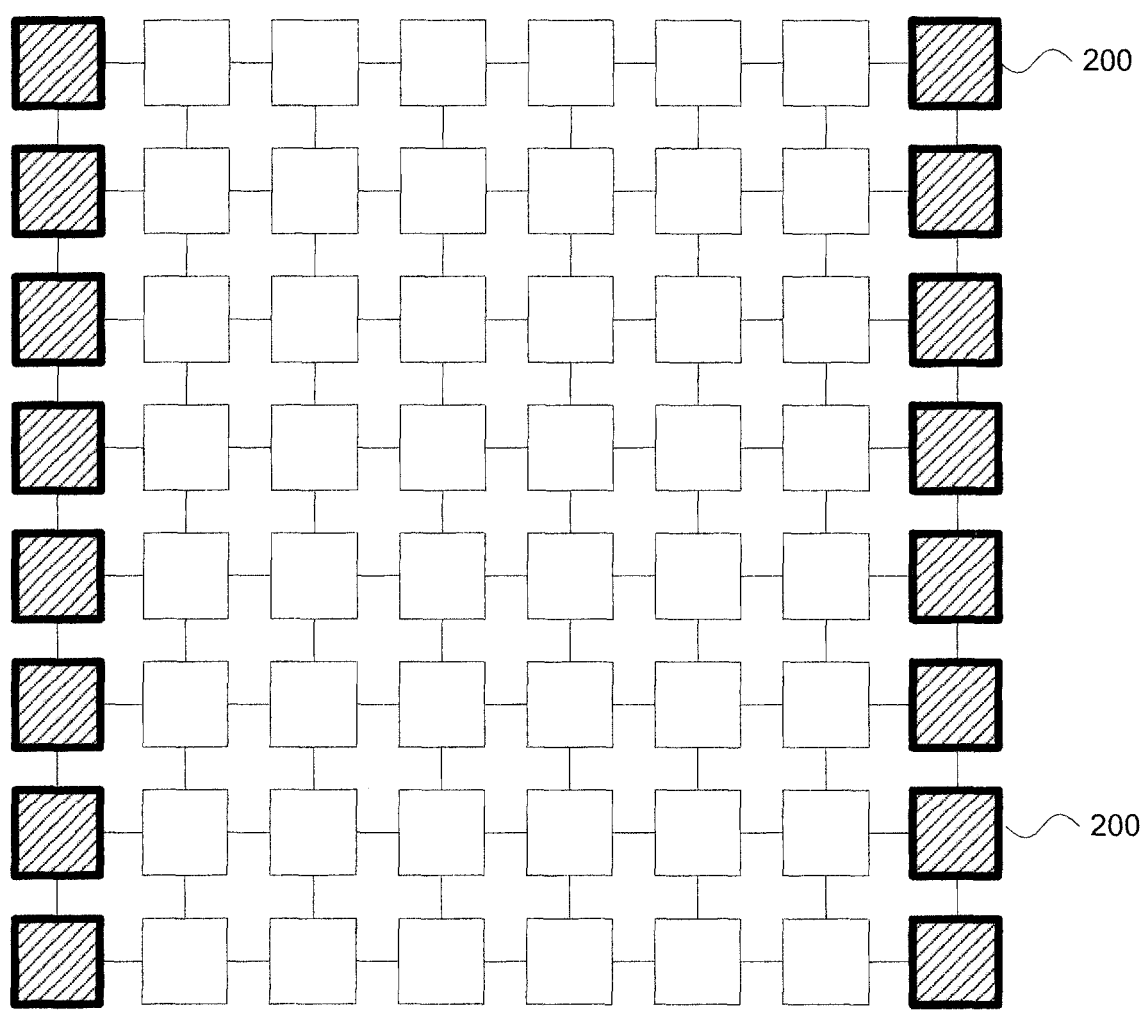

FIG. 2A provides an alternative representation of how the memory controllers of FIG. 1 couple to selected processors. This configuration is alternatively referred to as the "row0_7" configuration. As shown by the shaded processors in FIG. 2, ingress/egress ports 200 of the memory controllers (not shown) are co-located with the processors along the top and bottom rows of the architecture's array. And as shown in the alternative arrangement of FIG. 2B, the ingress-egress ports 200 are co-located with the processors along the left and right-most columns in the array. The FIG. 2B configuration is alternatively referred to as the "col10_7" configuration.

In one embodiment, all possible permutations of memory controllers in both mesh and torus topologies that are common in two-dimensional on-chip networks are expressly enumerated. Simulation has been used to find the configuration that minimizes the maximum channel load. While exhaustive simulation is possible for modest-sized on-chip networks (e.g., k<7); larger networks such as an 8×8 mesh are analyzed using a heuristic-guided search to deal with computational complexity that arises from a large search space. In another embodiment, the design space of on-chip networks is analyzed to show how memory controller configurations and routing algorithms can improve the latency and bandwidth characteristics as well as reduce variance of the network for both synthetic and full system workloads.

Memory controller configuration solutions may be tested or otherwise analyzed in different ways. For instance, one procedure employs link contention simulation to trace the path a packet takes through the network and increments a count on each link that it traverses. This count represents the channel load, or contention, that would be observed by the link if the processors were simultaneously active.

In one example, the link contention simulation employs a simulator that traces the path of each packet. The network is modeled as a group of nodes interconnected with unidirectional channels. As a packet traverses each unidirectional channel, a counter associated with that channel is incremented. The count is compared to the current max channel load value. The maximum channel load is tracked as a proxy for the delivered bandwidth, because the accepted bandwidth will ultimately be limited by the channel with the highest contention, or channel load. Preferably, all processor-to-memory references are modeled by having each processor choose a random memory controller in which to send a request. Once the request packet reaches the destination memory controller, the reply packet is sent back—again, tracing the path of the packet as it heads back to the requesting processor tile. In one scenario, 10,000 trials are employed, averaging the maximum channel load across all the trials. This average value is used as a figure of merit for evaluating different memory configurations.

A contention simulator may be used to enumerate all possible placement options. Here, the process may then simulate 10,000 trials for each configuration. This can be performed for both mesh and torus topologies. For symmetric topologies, such as the torus, there is a lot of symmetry that can be exploited. However, the simulator may not take such symmetry into account. Therefore, it is possible for multiple configurations to be viewed as "best" (i.e., perform identically).

An on-chip network with n tiles and m memory controllers will have $$\binom{n}{m}$$

possible memory configurations that must be compared against each other in order to choose the best solution (e.g., lowest contention or channel load). The link contention simulator may be used to exhaustively search modest-sized fabrics. However, networks larger than 6×6 may be too computationally intensive to analyze exhaustively. Alternative approaches in such cases include evaluation using genetic algorithms and random simulation. Any combination of these approaches (link contention simulation, genetic algorithm and/or random simulation) may be employed to arrive at an optimal memory controller configuration(s).

By providing multiple simulation approaches at differing levels of abstraction, it is possible to validate and gain a better understanding of issues that may exist in one simulation environment, but not others. For example, using a TPC-H benchmark, it may be apparent that some memory controllers are accessed much more frequently than others—with some memory controllers having up to 4× the load of others. To mimic this "hot spot" traffic pattern, this pattern may be applied as input to a detailed topology and routing simulator by choosing the destination memory controller according to the distribution observed by a full system simulator. In this embodiment, simulation models may be validated at differing levels of abstraction.

Genetic algorithms take a heuristic-based approach to optimization. They are inspired by DNA's ability to encode complicated organisms into simple (if lengthy) sequences. Each sequence represents a potential solution to the problem under optimization. In the instant case, solutions are represented as bit vectors. Set bits in the vector represent locations of memory controllers in the topology. In the course of execution, solutions are combined to produce new solutions (analogous to chromosomal crossover), and new solutions are randomly perturbed (i.e., mutated) with some probability to prevent convergence on local minima. Each new solution is evaluated and assigned a fitness.

The nature of crossover, mutation, and fitness evaluation operations is specific to the problem to be solved. The fitness of each solution is the reciprocal of the maximum channel load for that configuration. In one scenario, a crossover algorithm selects two parent solutions from a large population, with probability proportional to the potential parents' fitness, and then randomly selects bits from the parents to form a new solution.

The mutation operation swaps adjacent bits in the vector. In order to maximize the effectiveness of the heuristic, a particular bit vector may not be evaluated more than once. Instead, a mutation is repeatedly applied to redundant solutions until a new solution is discovered. In one scenario, a genetic simulator executes a fixed number of generations or returns a solution when stagnation occurs in the population.

Link contention simulation may be extended to perform a random walk of the design space. Initially this may be done by randomly selecting a valid memory controller configuration and keeping track of which configuration has the least contention. As a figure of merit, maximum channel load may be used as a proxy for accepted bandwidth. The configuration with the lowest maximum channel load will have less congestion, and as a result, the best delivered bandwidth.

When a configuration is found that is better than all other previously explored, that configuration is identified and an "effort counter" is cleared. An effort parameter to the simulator determines how many configurations are searched before terminating the simulation and declaring a solution. Through experimentation, it has been found that an effort level of 7,000 provided a reasonable trade-off between search quality and time to solution, which was usually less than a few hours.

As noted above, memory controller configuration solutions may be tested or otherwise analyzed in different ways. Another procedure employs a detailed, event driven simulator to explore topology and routing sensitivity to different memory controller placement alternatives. In this case, a cycle-accurate network simulator may be used with synthetic traffic to evaluate the impact of alternative memory controller placement within the on-chip fabric and explore different routing algorithms. Both uniform random ("UR") traffic, as well as hotspot traffic, may be used when processor-to-memory accesses are known to be non-uniform.

In event driven simulation according to aspects of the invention, memory controller placements are analyzed using synthetic traffic patterns. One scenario involves evaluating an 8×8 mesh with dimension-order routing ("DOR") algorithms, including: XY, YX, and XY-YX randomized routing. A novel class-based deterministic routing ("CDR") approach has been compared against DOR. Details concerning CDR may be found in co-pending U.S. patent application Ser. No. 12/487,832, entitled "Class-Based Deterministic Packet Routing," filed concurrently herewith, the entire disclosure of which is hereby incorporated by reference.

As explained in the co-pending application, router switches may implement the CDR routing. Each router switch may be coupled to one of the nodes in the array and is operable to direct the message packets to an adjacent node in the array. By way of example only, router switches for use with the invention may comprise five-port switches. In this case, four of the ports may be directly connected to adjacent nodes while the fifth port is connected to the processor co-located at the same node as the switch.

XY routing is a DOR technique where packets are first routed in the X dimension followed by the Y dimension. YX routing is a DOR technique where packets are first routed in the Y dimension followed by the X dimension. And in XY-YX routing, at the source the routing path to the destination is randomly selected, routed using either XY DOR or YX DOR.

Class-based deterministic routing takes advantage of both XY and YX routing but the path is determined by the message type. In one example of CDR, memory request packets use XY routing while memory reply packets take YX routing.

For both XY and YX routing, no additional virtual channels ("VCs") are needed to break routing deadlock, but additional VCs are need to break protocol deadlock. For XY-YX routing, in addition to VCs needed to break protocol deadlock, additional VCs are needed to break routing deadlock. However, for CDR routing, the VCs used to break routing deadlock can also be used to break protocol deadlock, thus the number of VCs needed is reduced compared to XY-YX routing.

To maximize the effective memory bandwidth, the traffic offered to each memory controller should be as close to uniform as possible. However, some applications may exhibit non-uniform traffic because of shared locks, for example. Thus, alternative memory controller placement may be evaluated using both uniform random (UR) traffic, where each processor emits packets destined to a randomly selected memory controller, and the "hot spot" traffic based on the distribution shown in FIG. 3. FIG. 4 provides three tables (Tables 1-3) showing simulation parameters, benchmark descriptions and a full system simulation configuration for the scenario shown in FIG. 3.

In synthetic traffic evaluation, both open-loop simulation and closed-loop simulation may be employed. Open-loop simulation involves the metric of measuring latency vs. load to obtain network characteristics such as zero-load latency and the throughput. Closed-loop simulation may be used when measuring the response of the network to compare overall performance. For open loop simulation, packets may be injected using a Bernoulli process.

Figure 3:
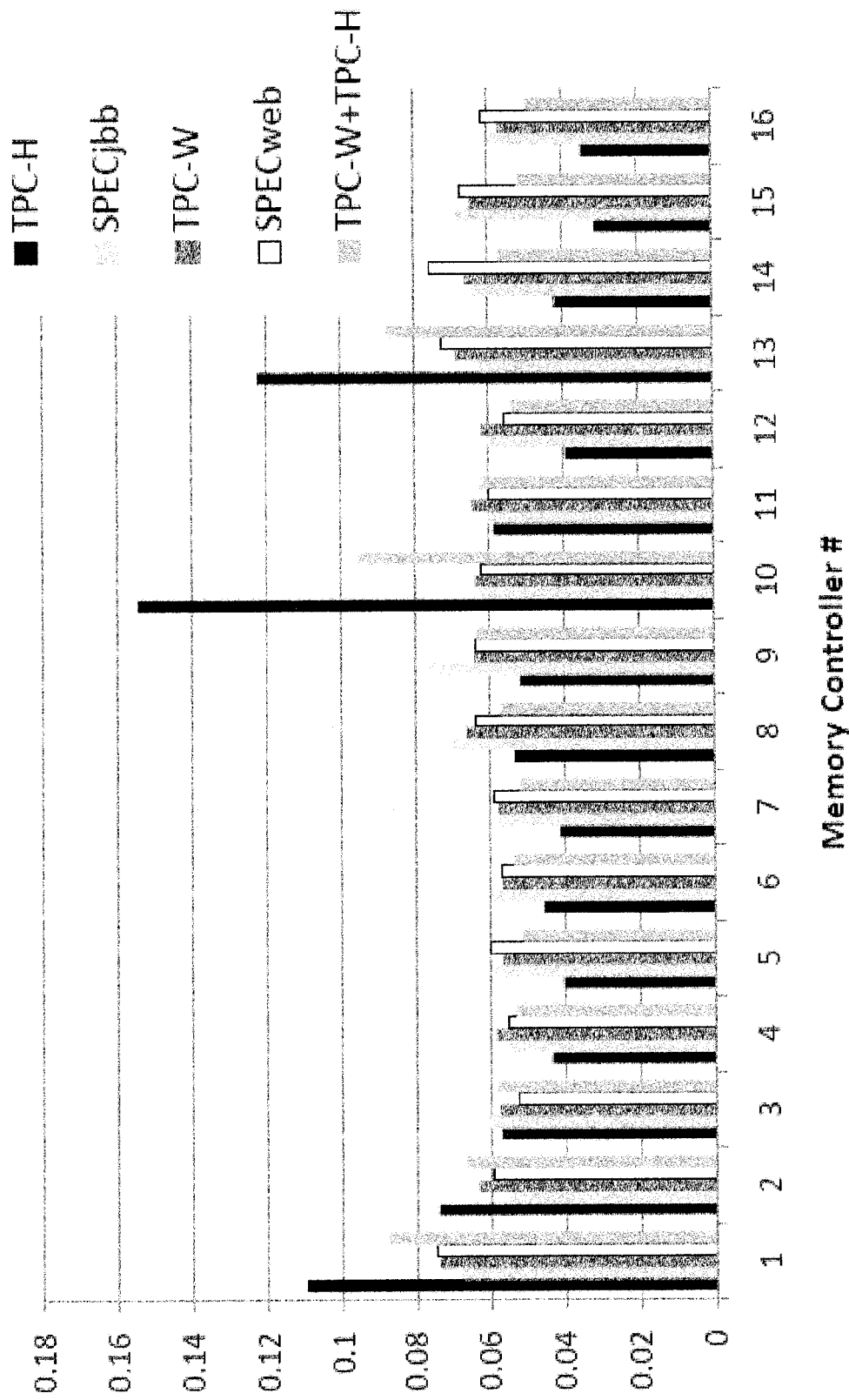
FIG. 3 is a chart illustrating memory controller usage distribution in accordance with aspects of the invention.

In the FIG. 3 scenario, a simulator is warmed up under load without taking measurements until steady-state is reached. Then a sample of injected packets are taken during a measurement interval. Parameters used in both closed and open loop simulations can be found in Table 1 of FIG. 4.

To understand the impact of memory traffic, the memory traffic may be separated into three different simulations in the steady-state simulation evaluation using synthetic traffic patterns. Request traffic only ("REQ") is traffic only for the memory controller which are injected by the processors. Reply traffic only ("REP") is traffic that only the memory controllers inject into the network. Request and reply traffic may also be employed.

Returning to FIG. 3, different commercial workload scenarios or benchmarks were evaluated, namely TPC-H, TPC-W, SPECweb99 and SPECjbb2000. The TPC-H and TPC-W scenarios are provided by the Transaction Processing Performance Council. The SPECweb99 and SPECjbb2000 commercial workloads are provided by the Standard Performance Evaluation Corporation. Benchmark descriptions can be found in Table 2 of FIG. 4, with simulation configuration parameters listed in Table 3 of that figure. In four out of the five scenarios shown, accesses were fairly uniformly distributed across 16 memory controllers. The TPC-H distribution generated "hot spot" traffic.

As discussed above, to gain additional insight a full system simulation may be used in conjunction with the above methods. In the link-contention simulator and the network-only simulators only processor-to-memory and memory-to-processor traffic may be considered. Full-system simulation includes additional traffic, e.g., cache-to-cache transfers that can interact with the memory-bound requests.

In order to evaluate large systems (e.g., 8×8 processor arrays or larger), a simulation environment may be configured to support server consolidation workloads. In this case, each server workload runs inside of a virtual machine with a private address space. Threads of the same virtual machine may be scheduled in a 4×4 quadrant to maintain affinity. Each virtual machine preferably accesses all memory controllers on chip.

Figure 5A:
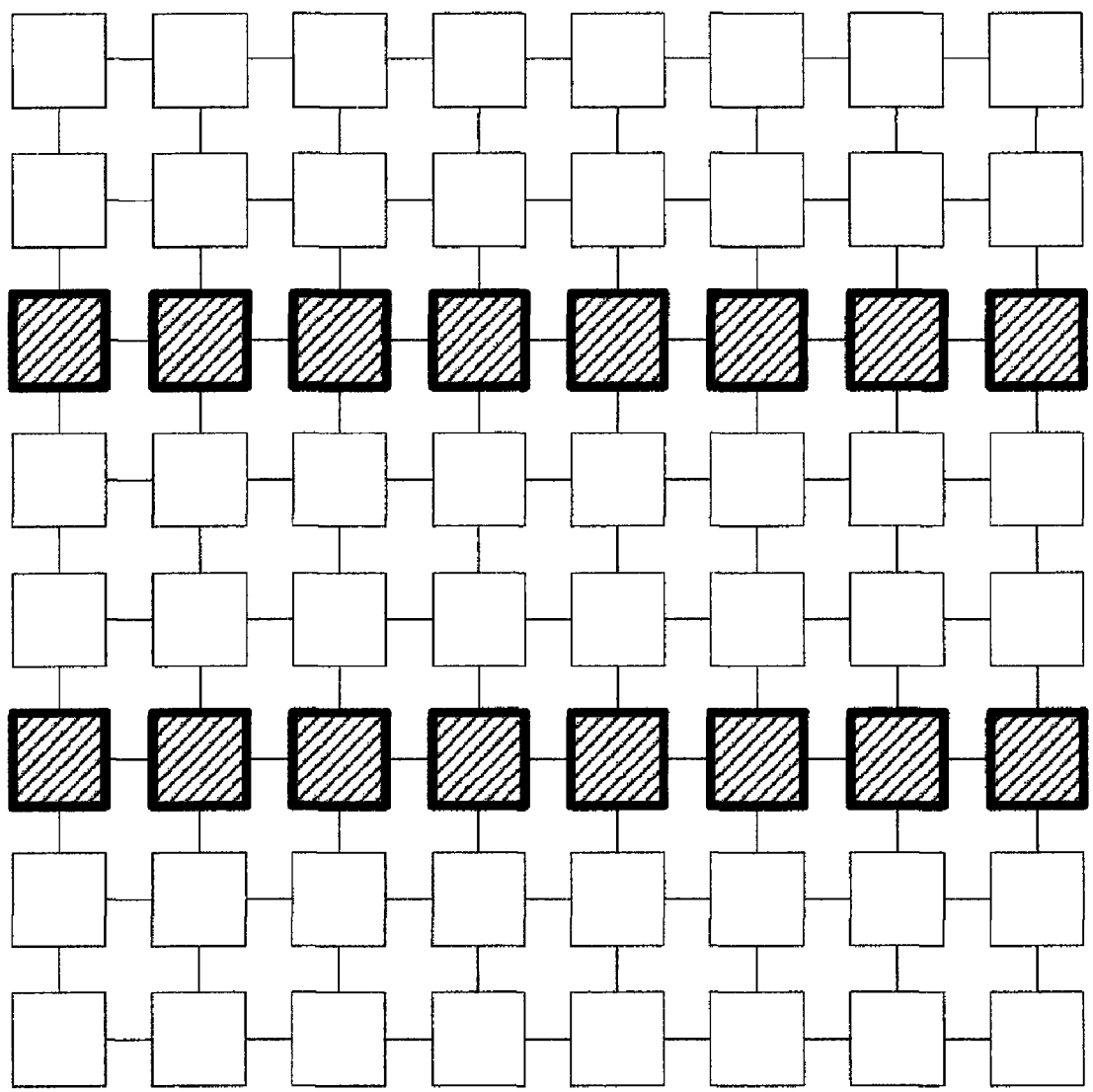
FIGS. 5A-D illustrate various memory controller configurations in accordance with aspects of the invention.
Figure 5B:
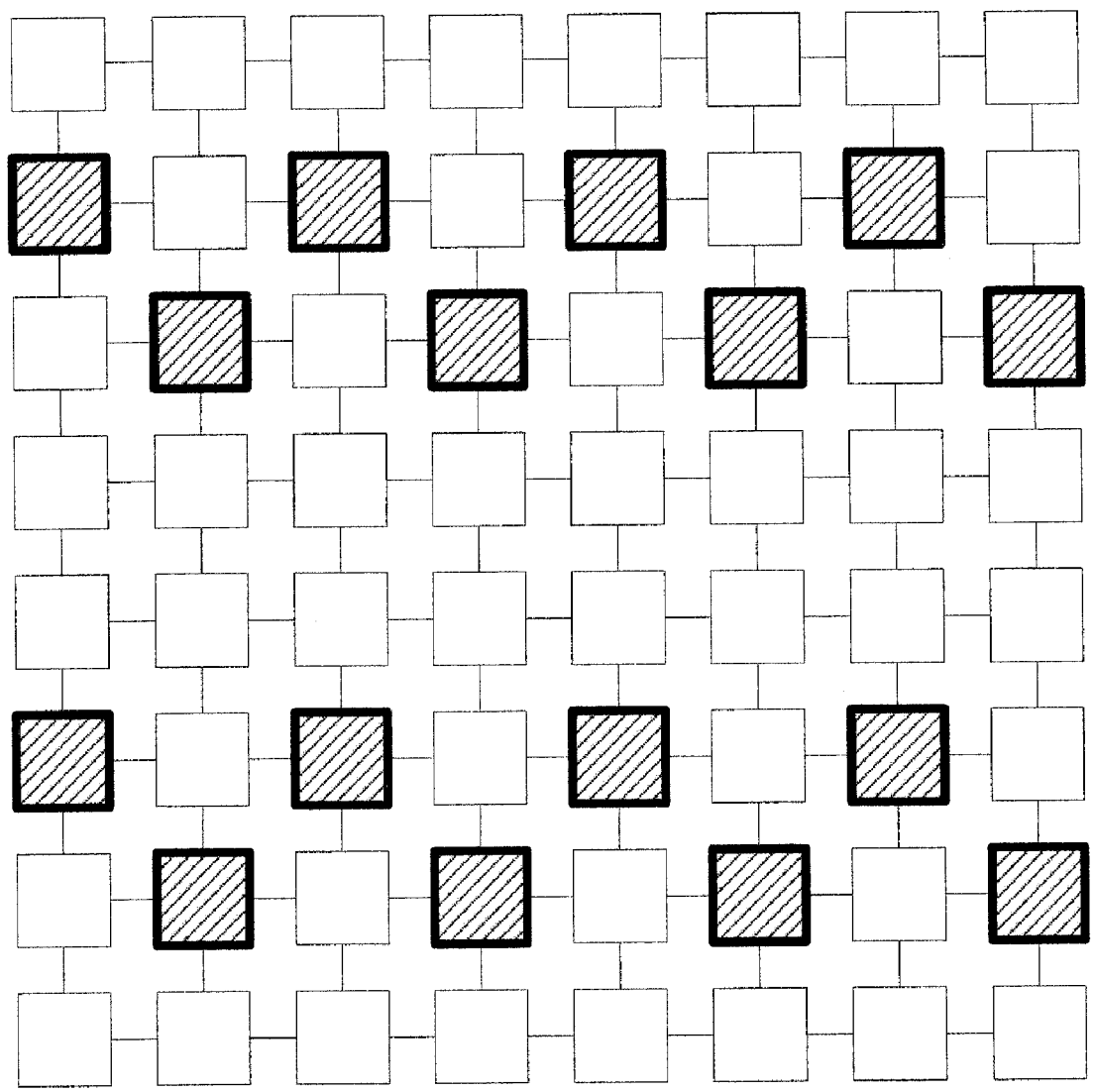
Figure 5C:
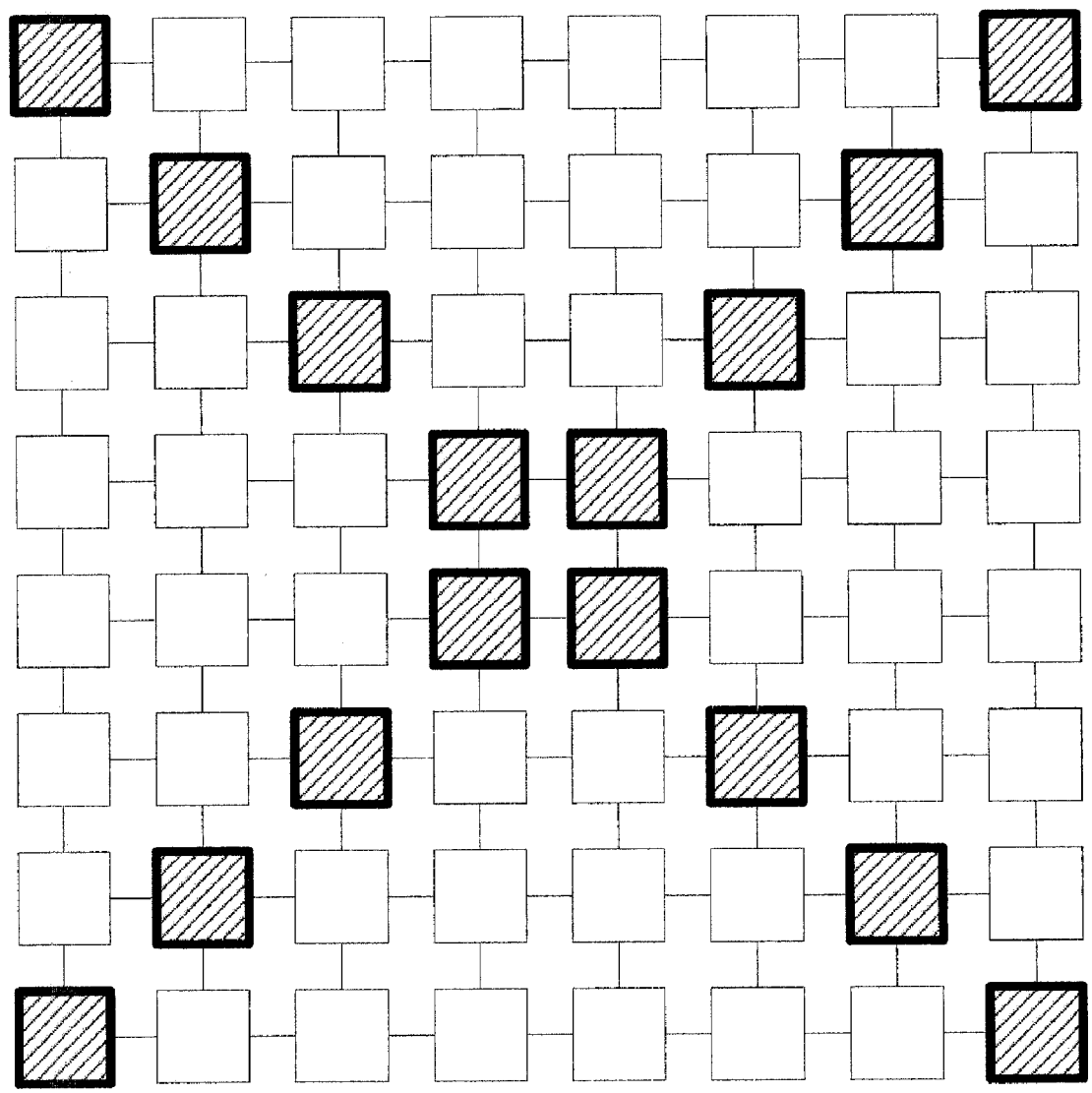
Figure 5D:
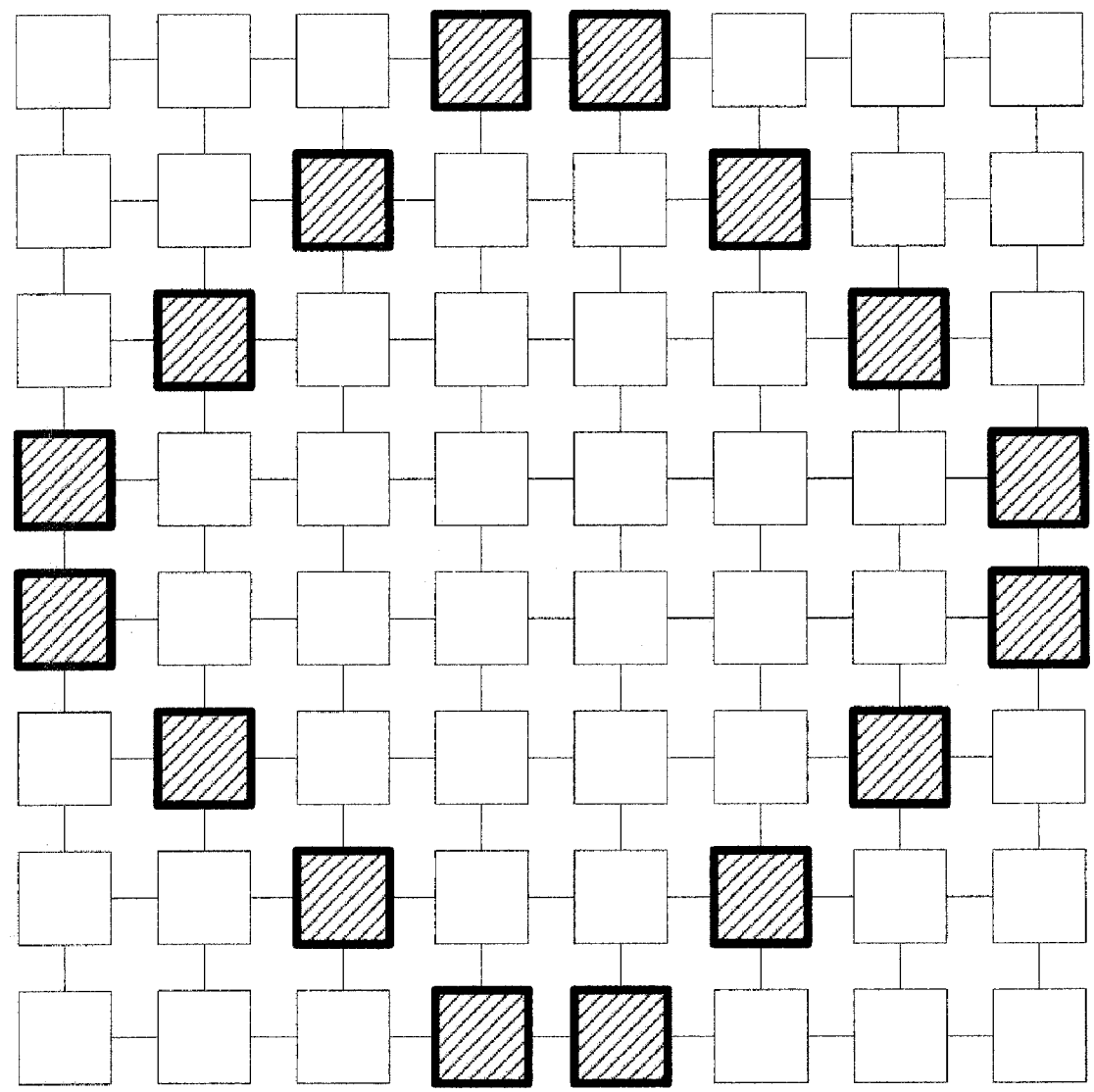

As discussed above, the top/bottom and left/right memory controller arrangements of FIGS. 2A-B present two possible configurations which may be used with a multiprocessor array. In accordance with aspects of the invention, other memory controller arrangements have been discovered which outperform the configurations in FIGS. 2A-B. For instance, FIG. 5A illustrates a configuration wherein the memory controllers are connected to the processors along the third and sixth rows in the array. This configuration is alternatively referred to as the "row2_5" configuration. FIG. 5B illustrates a checkerboard configuration wherein the memory controllers are connected to the odd (or even) processors along the second and sixth rows and are connected to the even (or odd) processors along the third and seventh rows. Similar memory controller arrangements to FIGS. 5A and 5B may be employed by arranging the memory controllers along the vertical columns instead of the horizontal rows. FIG. 5C illustrates a diagonal or X ("diagonal X") type memory controller configuration. And FIG. 5D illustrates a diamond-type controller configuration. Each of these configurations has been evaluated using the processes described herein. A discussion of results is provided below.

Link contention simulation as discussed above may be used to provide a first-order comparison of different memory controller configurations and exhaustively search for an optimal solution in relatively small on-chip networks (e.g., $k \leq 6$). When exhaustive searching becomes intractable (e.g., k>6) a heuristic-guided search may be used to find near-optimal solutions.

In one example, 4×4, 5×5 and 6×6 mesh and torus on-chip networks were exhaustively simulated according to aspects of the invention. From this simulation, it has been discovered that configurations that spread the processor-to-memory traffic across the diagonal of the array performed notably better than others. The table in FIG. 6 shows the simulation results for an 8×8 array of tiles organized according to the arrangements shown in FIGS. 2A-B and 5A-D. The diagonal X and diamond configurations of FIGS. 5C-D performed 33% better than the baseline of FIG. 2A.

For networks larger than 8×8, a heuristic-guided search has been employed to find optimal/near-optimal solutions. The best solution discovered had a maximum channel load of 9.35, within 5% of the diamond and diagonal X configurations. Using a genetic algorithm with a population size of 500 configurations for 100 generations yielded a near optimal solution with a maximum channel load of 9.21, within 4% of the diamond and diagonal X memory configurations which have the least channel load.

Figure 7:
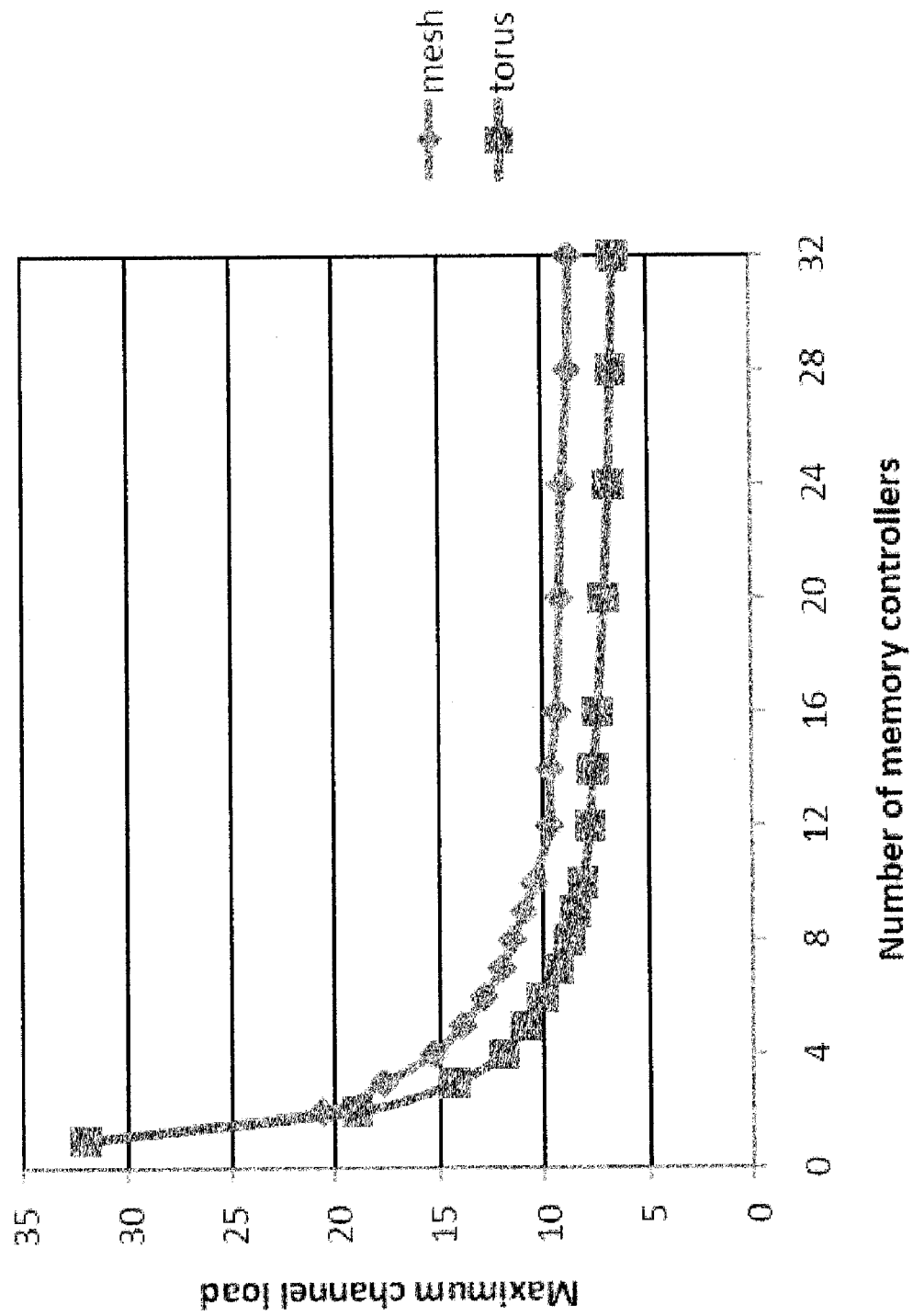
FIG. 7 is a chart illustrating maximum channel load versus the number of memory controllers in accordance with aspects of the invention.

The diamond configuration does not locate multiple memory controllers in the center of the chip, which may increase escape complexity. Using a randomized search, the design space may be swept to determine the impact of having many processor cores and few memory controllers. As the number of memory controllers varies, one can search for the best memory configuration, and note the maximum channel load for that configuration. FIG. 7 illustrates results for maximum channel load versus the number of memory controllers with an 8×8 processing array.

It has been discovered that for an 8×8 array, at least 12 memory controllers are required to adequately spread the processor-to-memory traffic across enough links to avoid hotspots. See FIG. 7. Even if every tile in the array had a memory controller attached to the associated processor, resulting in a perfectly uniform random traffic distribution, a mesh would still have a maximum channel load that was 3× the average channel load. Clearly, not all the congestion is due to the many-to-few traffic patterns in the processor-to-memory links. Some contention is due to routing. This may be addressed using the CDR routing procedure discussed above.

As shown in the table in FIG. 7, the diamond controller arrangement of FIG. 5D has a substantially equivalent performance to that of the diagonal X arrangement of FIG. 5C. However, the diamond arrangement may have more desirable physical layout properties than the diagonal X because the diagonal X locates multiple memory controllers in the center of the chip (unlike the diamond), which may increase escape complexity. In view of this, the subsequent discussion will focus on the diamond arrangement, although the results apply similarly to the diagonal X arrangement.

Figure 8B:
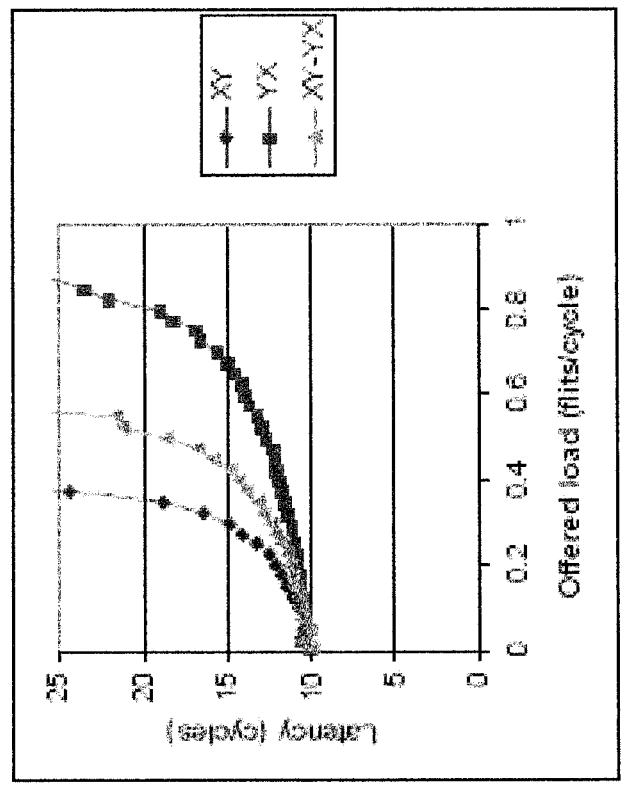
Figure 8A:
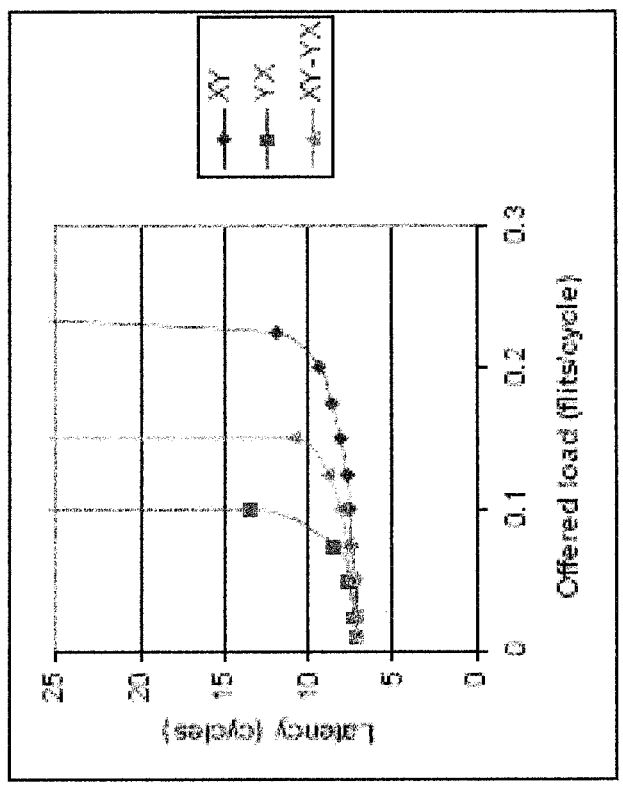

Latency versus offered load curves are shown FIGS. 8A-F comparing the memory controller arrangement in FIG. 2A with the diamond configuration of FIG. 5D memory controller placement for uniform random (UR) traffic. For the row0_7 arrangement and for request traffic only as shown in FIG. 8A, XY routing is sufficient and reaches maximum throughput of 0.25 (since there are only 16 memory controllers and 64 processors in this example, the maximum injection rate at each processor is 64/16=0.25). However, as shown in this figure, YX routing performs poorly as it only achieves approximately half the throughput of XY routing. The use of randomization in routing (XY-YX) does not increase the performance and the achieved throughput is between XY and YX routing.

With the memory controllers distributed uniformly within the same row with the row0_7 placement of FIG. 2A, X-first DOR routing load-balances the traffic to find the appropriate Y-dimension before sending the traffic to its destination. However, YX routing sends all the traffic initially to the two x coordinates where the memory controllers are located—thus, causing congestion on the channels in the x direction for rows 0 and 7 which contain the memory controllers.

The impact of memory controller placement and routing algorithm on memory traffic can be estimated by measuring the channel load ($\gamma$) since the network throughput ($\theta$) is inversely proportional to the worst-case (maximum) channel load. The maximum channel load for an oblivious routing algorithm such as XY can be found by taking advantage of linearity of channel loading. A block diagram of a k×k 2D mesh (see FIG. 2A) with $\gamma Xi$ ($\gamma Yi$) corresponding to the channel load of row (column) i.

For request only traffic, with uniform traffic distribution and XY routing, $$\max(\gamma Xi)=(k/2)\lambda/2$$

$$\max(\gamma Yi)=k(k-1)\lambda/16 \qquad (1)$$

where $\lambda$ is the injection rate of each processor. The max ($\gamma Xi$) occurs in the middle or bisection of the network where k/2 nodes send half ($\lambda/2$) of their traffic to memory controllers located on the opposite half of the chip. The max($\gamma Yi$) occurs at the top near the memory controllers with k/(k-1) nodes sending traffic to the memory controller contributing to this channel. Since uniform distribution among the 16 memory controllers may be assumed, the actual load contributed from each processor will be $\lambda/16$. Thus, the throughput with XY routing is determined max($\gamma Xi, \gamma Yi$).

$$\theta_{XY}=16/(k(k-1)\lambda) \qquad (2)$$

With YX routing, the load on the channels will be:

$$\max(\gamma Xi)=k(k/2)\lambda/4$$

$$\max(\gamma Yi)=(k-1)\lambda/2 \qquad (3)$$

For i≠0; k-1, $\gamma Xi=0$ because all memory traffic is initially routed in the Y direction. Thus, the throughput with YX routing is determined by $\gamma X$.

$$\theta_{YX}=8/(k\times k\lambda) \qquad (4)$$

Based on equations 2 4, it can be seen that XY provides 2k/(k-1) increase in throughput compared to YX routing, and with k=8, XY results in≈2.3 increase in throughput compared to YX as illustrated in FIG. 8A. With randomized XY-YX routing, XY routing is used approximately for 50% of the packets and the rest of the packets use YX routing. Thus, the channel load for XY-YX routing can be found as the following.

$$\gamma Y(XY-YX)=1/2\gamma Y(XY)+1/2\gamma Y(YX)$$

$$\gamma X(XY-YX)=1/2\gamma X(XY)+1/2\gamma X(YX)$$

The actual channel load for XY-YX can be calculated by using equations 1 and 3. It can be seen that XY-YX routing does not provide any performance benefits but achieves throughput that is in between XY and YX routing as illustrated in FIG. 8A. For reply only traffic, the opposite is true in terms of the impact of routing. The use of XY routing creates a similar problem as the YX routing with request only traffic. Thus, YX routing provides better load-balancing for reply traffic,—transmit the packets to the appropriate row (or X dimension) and then, traverse the X dimension.

Similar to request traffic, XY-YX does poorly. When both the request and the reply traffic are combined as shown in FIG. 8C, both XY and YX routing perform similarly as the reply traffic creates a bottleneck for XY routing and request traffic creates a bottleneck for YX routing. However, CDR routing significantly outperforms other routing as it provides a nearly 2× increase in throughput. Both CDR and XY-YX routing take advantage of path diversity as some packets are routed XY and others are routed YX. However, by taking advantage of the characteristics of memory traffic (where ½ the traffic will be request and the remaining ½ is reply traffic), and the load-balanced traffic pattern, CDR deterministic routing based on the message type load-balances all of channels to provide high throughput while adding randomization achieves performance similar to XY or YX routing.

Figure 8D:
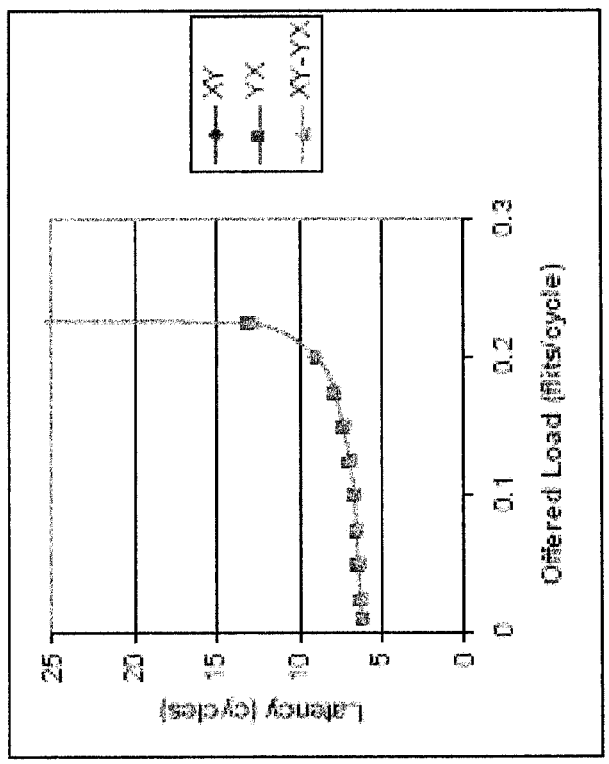
Figure 8C:
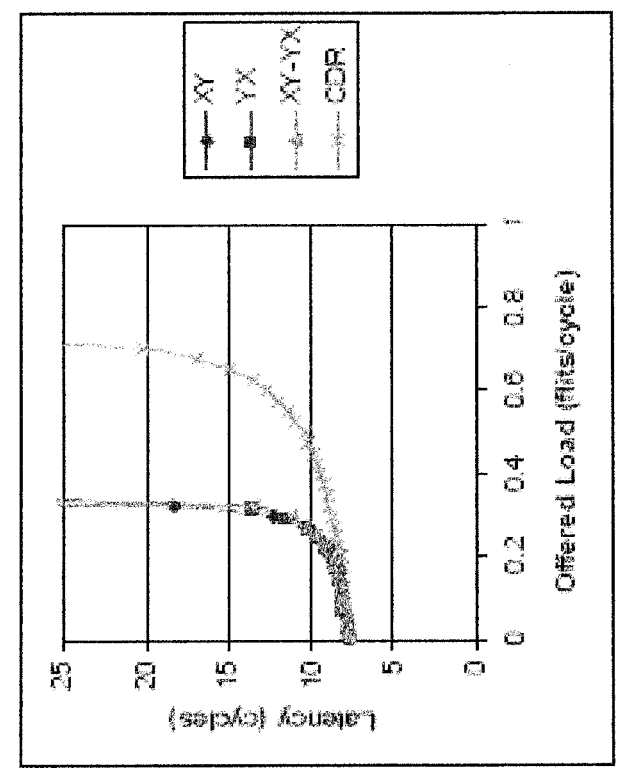

With the diamond placement of the memory controllers, the different routing algorithms have very little impact on the overall performance as shown in FIGS. 8D-F. Unlike the row0_7 placement which creates a hotspot row in the topology, the diagonal (and diagonal X) placement distributes the memory controllers across all rows and columns. Thus, even with CDR routing, there is very little benefit in terms of latency or throughput (FIG. 8F).

According to other aspects of the invention, the impact of routing algorithms and memory controller placement is considered through closed-loop evaluation using a batch experiment to model the memory coherence traffic of a shared memory multiprocessor. In this embodiment, each processor executes a fixed number of remote memory operations (N) (e.g., requests to the memory controller) during a simulation. The time required for all operations to complete is then measured.

Here, each processor is allowed to have r outstanding requests before the processor needs to halt injection of packets into the network and wait until replies are received from the memory controller. The on-chip network is evaluated in one example using values of 4 and 16 for r and 1000 for N.

Figure 9A:
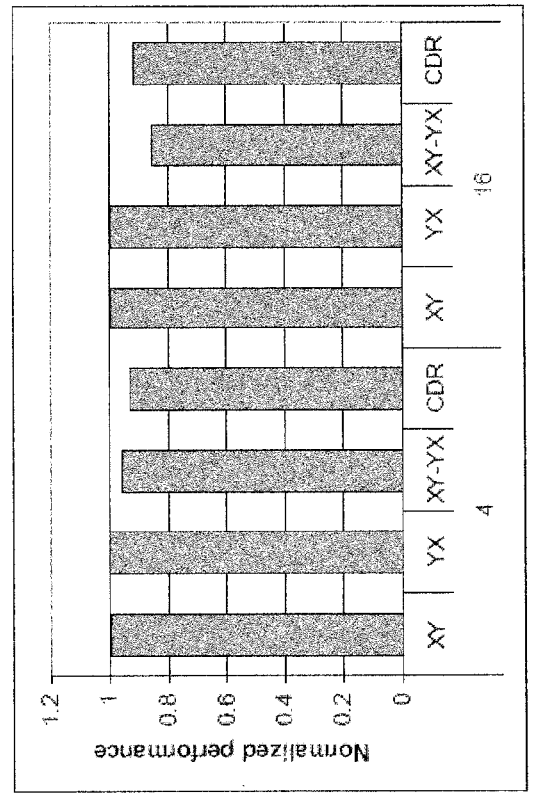
FIGS. 9A-D illustrate distribution plots for memory controller configurations in accordance with aspects of the invention.

Simulations according to aspects of the invention show that larger N did not change the trend in the comparisons. Using CDR routing, it can be seen that the limitations of the placement are overcome resulting in significant improvements for the row0_7 configuration as CDR balances the load to reduce the execution time by up to 45% with r=4 and up to 56% with r=16, as shown in FIG. 9A.

Figure 9B:
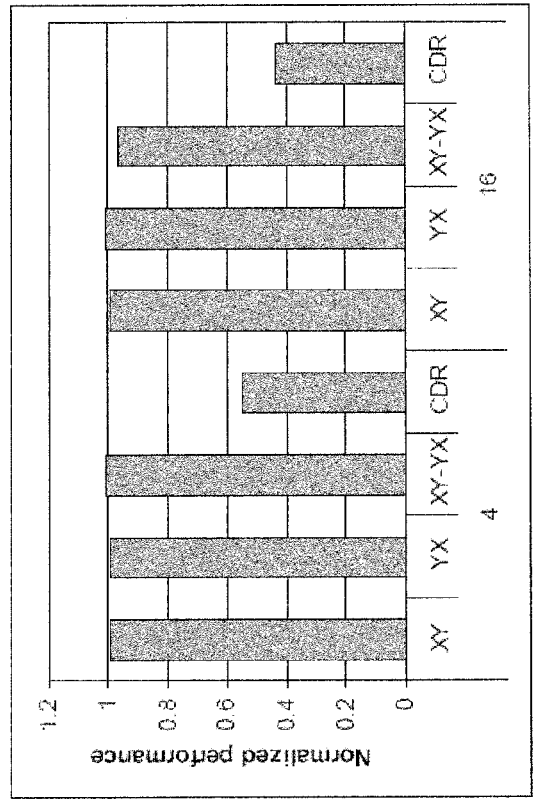
Figure 9C:
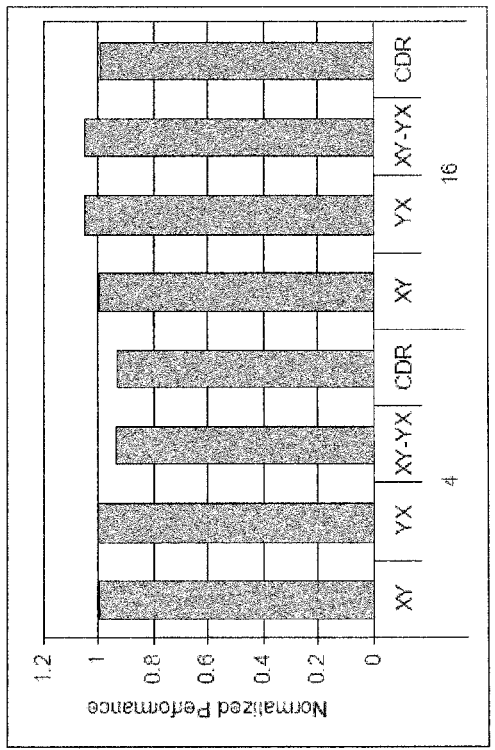
Figure 9D:
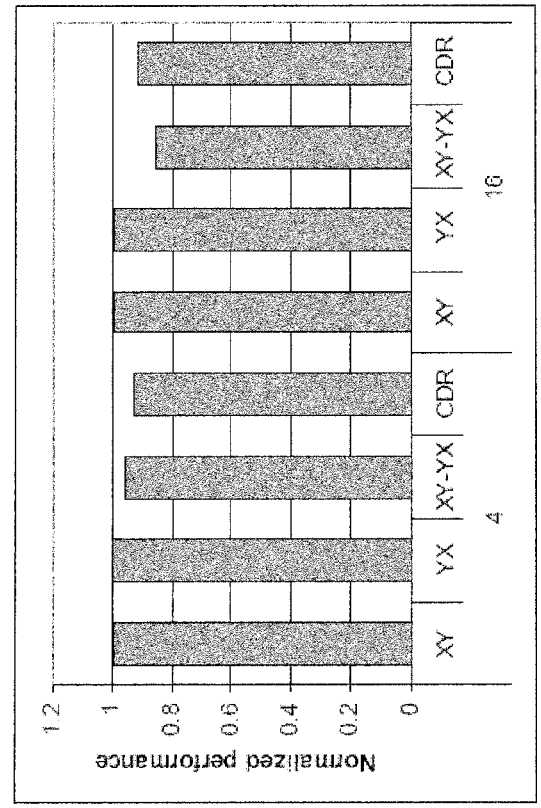

With higher r, the network becomes more congested and thus, proper load-balancing through the use of CDR routing enables significant performance advantage. With the diagonal placement and uniform random traffic (FIG. 9B), the benefit of CDR is reduced but it still provides up to 9% improvement in performance. With the hotspot traffic, the benefit of CDR is reduced as it provides up to 22% improvement with the row0_7 placement and up to 8% improvement with the diagonal placement.

For the batch simulations, the distribution of completion time for each of the processor is plotted as shown in FIGS. 10A-H. With the row0_7 placement (FIGS. 10A-D), the use of CDR provides not only higher performance in terms of lower completion time but also results is a much tighter distribution of completion—leading to a tighter variance. Balancing the load through XY-YX and CDR with the diagonal placement (FIGS. 10E-H) also results in a tighter distribution when compared to DOR.

In accordance with another aspect of the invention, full system simulation is used to validate results from synthetic traffic simulations as well as provide inputs to the event driven network simulator. Uniform random traffic is a widely accepted and used traffic pattern for evaluating on-chip networks. As discussed above, FIG. 3 shows the distribution of accesses (as a percentage of total memory accesses) to each memory controller for TPC-H, SPECjbb, and others. With most workloads, it has been observed that a uniform random traffic pattern will accurately mimic this workload; however, TPC-H generates hotspot traffic for which a uniform random pattern is not representative.

Figure 11:
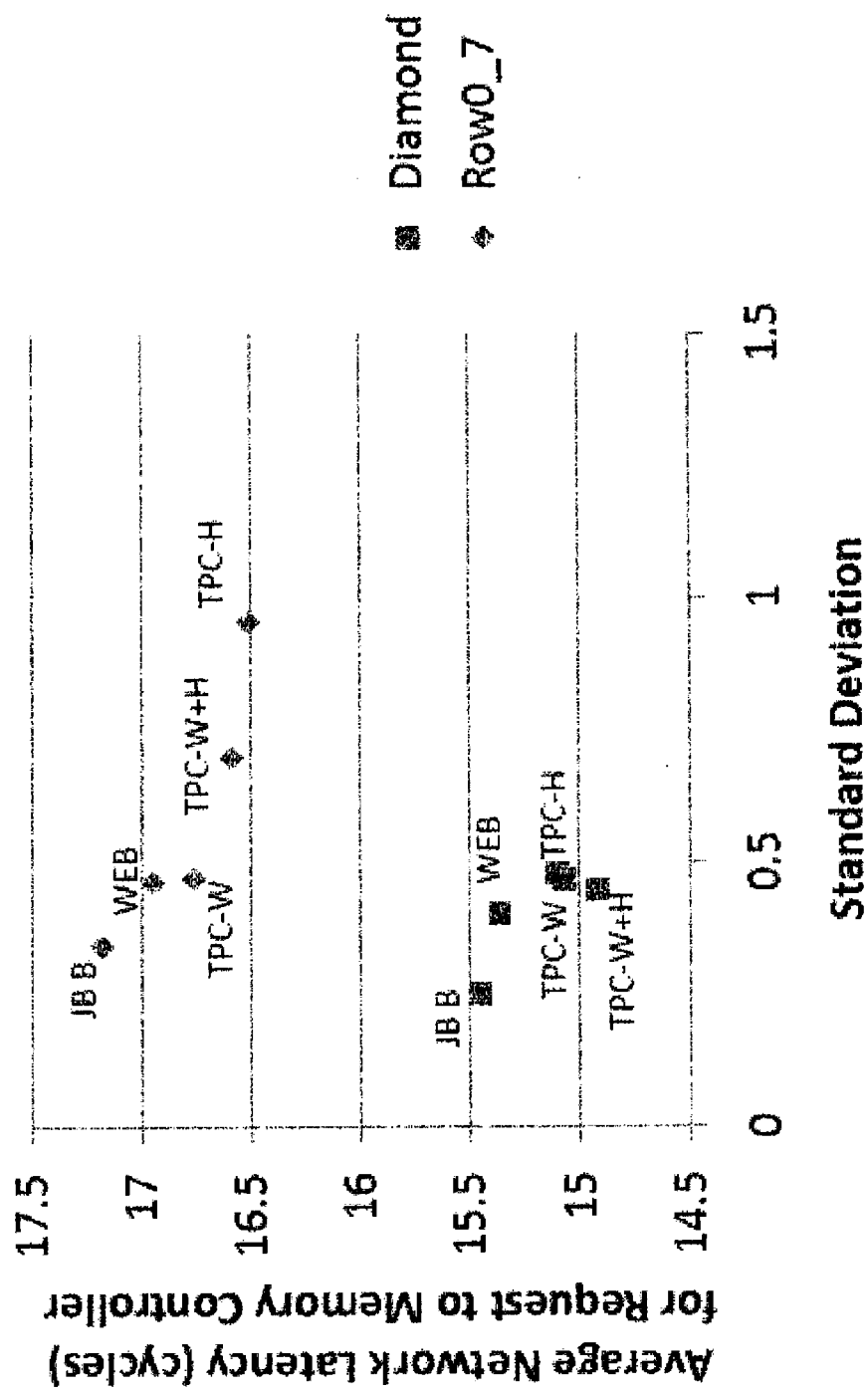
FIG. 11 is a chart showing the standard deviations of network latency for requests to memory controllers in accordance with aspects of the invention.

Near-optimal placement can provide predictable and fair access to the memory controllers through the on-chip network. With the closed loop batch experiment results present above, it is clear that placement can performance distribution for synthetic workloads. FIG. 11 shows the average latency each processor observes to access the memory controllers versus the standard deviation across all processors with dimension-ordered XY routing. Down and to the left are the results with the lowest average latency and smallest standard deviation.

Each workload has been simulated with a diamond and a row0_7 configuration. Four homogeneous server consolidation mixes and one heterogeneous mix of TPC-H and TPC-W were simulated in this example. With the diamond configuration, each processor not only experiences lower latency, but there is less variation in the latencies observed by each processor. Choosing a good placement improves network latency to memory controllers by an average of 10% across the various workloads.

A lower standard deviation across the observed latencies between processors and memory controllers indicates that with a diamond configuration and simple routing, access to memory is both predictable and fair regardless of which processor core a thread is scheduled to execute. The tight cluster of results for the diamond configuration indicates that an architect can size buffers and hardware structures to tolerate the average latency plus a small delta. These structures do not need to be sized to accommodate along tail distribution of memory latencies.

As discussed herein, aspects of the invention employ simulation techniques at multiple levels of abstraction starting with a fast link contention simulator that exhaustively simulates all possible permutations of memory controller placement, choosing the memory configuration that minimizes the maximum (worst-case) channel load. These simulations may be used to narrow down the field of candidate memory controller configurations. It has been shown that diamond (and similarly diagonal X) placement performs the best using dimension-ordered routing because it is able to spread traffic across all rows and columns.

It has been shown that the diamond placement has 33% less link contention compared to the baseline row0_7 placement of FIG. 2A. Simulations were used to show solutions for an 8×8 mesh could not be improved upon when exhaustive search proved to be computationally intractable. It was shown that existing routing algorithms, including dimension-ordered routing (DOR) with either XY and YX as well as randomized XY-YX, are not sufficient to load balance the processor-to-memory traffic on a 2D mesh.

Detailed simulation also shows that even a naive memory controller placement could be improved upon using better routing algorithm to avoid hot spots that would otherwise arise in the processor-to-memory traffic. Class-based deterministic routing routes request packets using XY dimension-ordered routing, and reply packets route using YX dimension-ordered routing. Implementing the baseline row0_7 placement with CDR routing can improve performance by up to 56% for uniform random (UR) traffic, and 22% improvement with hotspot memory traffic. With diamond placement, a more modest 8% improvement from the CDR routing algorithm occurs because the diamond placement efficiently spreads the offered load among the rows and columns of the mesh leaving less room for improvement from the routing algorithm.

The full system simulation results discussed herein show that the diamond (and similar diagonal X) placement has a significantly lower variance than the row0_7 placement (see FIG. 11). This lower variance provides more predictable latency-bandwidth characteristics in the on-chip network regardless of which processor core the application is using. A 10-15% improvement in network latency is also observed with the diamond placement.

Figure 12:
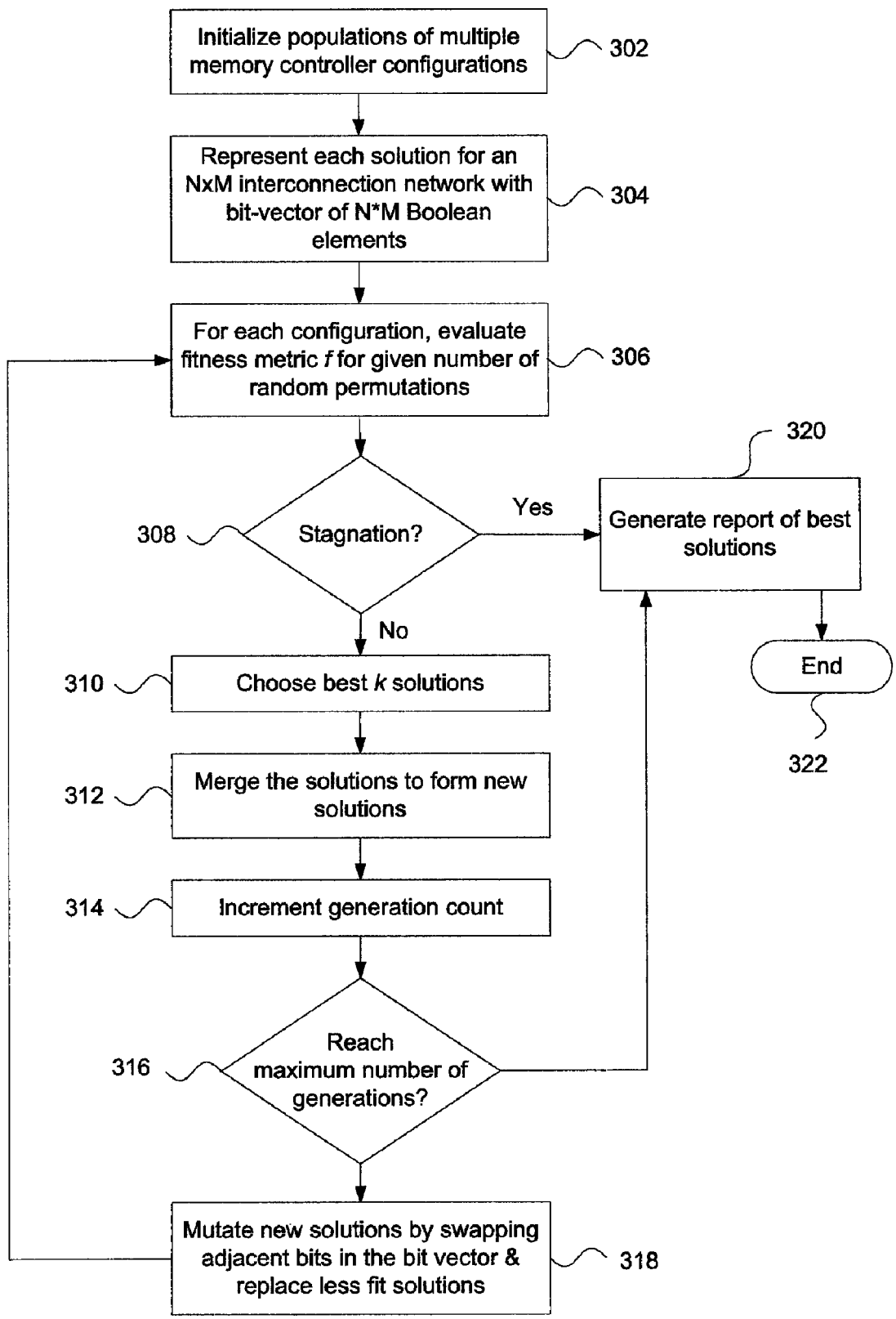
FIG. 12 is a flow diagram illustrating a process for selecting an optimal memory controller configuration in accordance with aspects of the present invention.

Turning to FIG. 12, a process 300 for selecting an optimal memory controller configuration(s) is provided according to an embodiment of the invention. Aspects of genetic algorithms are incorporated as discussed above. As shown in block 302, the populations of multiple memory controller configurations are initialized. For instance, several hundred random memory controller configurations may be initialized for an 8×8 (or larger) processing array. As shown in block 304, each solution for an N×M interconnection network is represented by a bit vector of N*M Boolean elements. In one example, a logical "1" may signify a memory controller in a given location, while a logical "0" may signify no memory controller in that location.

For each memory controller configuration a fitness metric f is evaluated as shown in block 306. The fitness metric f is determined based upon a worst-case channel load over X random permutations. The fitness metric for a given memory configuration "C" may be expressed as f=fitness(C), where "fitness" is a contention simulator which accepts as its input a given configuration (C) and simulates random permutation traffic for the network with memory controllers at specified locations of "C". The worst-case channel load will be the "bottleneck link" in the network and ultimately limit the network's throughput. So, the fitness metric may be represented as a floating point number (e.g. 3.57) which represents the highest (worst-case) observed channel load over the course of simulating 10000 random permutation trials.

For small on-chip networks, such as a 4×4 mesh with 8 memory ports, there are a total of $$\binom{16}{8}$$

or 12,870 different placements to evaluate. A 5×5 mesh with 10 memory ports has 3,268,760 different possibilities, and a 6×6 mesh has over one billion possible placements. Thus an 8×8 mesh with 16 memory ports has $4.9 \times 10^{14}$ different configurations, making exhaustive search of the design space intractable for any network larger than 6×6. X may be, by way of example only, 10,000 permutations. Other values or ranges, e.g., 1,000, 5,000, 15,000 or 25,000 may be selected based upon system complexity, time constraints and the like.

Next, at block 308 a determination is made whether the process has stagnated, quiesced or otherwise converged to an optimal solution. It can be determined if the algorithm has converged on a solution by checking if there is no measurable difference in the fitness metric over the course of several generations—in other words, whether the process has evolved to a local maxima. To do this, the variance of all the solutions may be computed. If the variance over several generations is small, then stagnation may be detected. Stagnation as used herein is determined as no improvement in the observed fitness over a given time interval. The time interval, e.g., 10 ms or 10 seconds, may vary depending on system complexity, program resources, etc. If there is no stagnation, then the process proceeds to block 310; otherwise it proceeds to block 320.

At block 310, the k best memory controller placement solutions are chosen or otherwise selected. By way of example only, k may be on the order of 10, 25 or 100 solutions. At block 312, these k solutions are merged to form new solutions. Merging may be done by randomly selecting two parents and selecting bits from each parent to form new solutions. Then, at block 314 a generation count is incremented.

At block 316 a determination is made whether the maximum number of generations has been reached. In one example, several hundred generations (e.g., 200 or 300) may be used as a maximum. In such an example, convergence to a solution or stagnation may occur, e.g., after 70 or 80 generations. If the maximum has not been reached, then the process proceeds to block 318. At block 318, new solutions are mutated. For instance, adjacent bits in the bit vector may be swapped. The mutated solution(s) replace any less fit solutions. Thus, if a mutated solution can handle a lower worst-case channel load than its parent, then the mutated solution replaces the parent.

If the maximum number of generations has been reached, then a set of optimal memory controller solutions has been found and the process proceeds to block 320. In block 320, the process may generate a report or list of the solutions. This report may be stored in memory and/or displayed or otherwise produced to a user. Upon completion, the process ends at block 322.

The processes and operations set forth herein may be implemented directly by one or more hardware-based processors such as sub-processing units in a multiprocessor array. Alternatively, the processes and operations may be stored in a computer-readable recording medium such as flash memory, a CD-ROM, a hard drive and the like. In the latter case, the information may be stored in electronic format as a program for execution by the processor(s).

Aggressive many-core designs based on tiled microarchitectures may have dozens or hundreds of processing cores, but packaging constraints such as the number of pins available can limit the number of memory controllers to a small fraction of the processing cores. As disclosed herein the location of the memory controller within the on-chip fabric plays a central role in the performance of memory-intensive applications.

Although aspects of the invention herein have been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the invention as defined by the appended claims. Unless otherwise expressly stated, features from each embodiment of the invention may be used with features from any other embodiment of the invention.

The invention claimed is:

1. A method of selecting a memory controller configuration for an N×M multiprocessor array, the method comprising:
    initializing a population including multiple memory controller configurations, each memory controller configuration including a plurality of memory controllers for coupling to selected processors in the multiprocessor array;
    representing each memory controller configuration solution by a bit vector of N*M Boolean elements;
    evaluating a fitness metric for the bit vector of each memory controller configuration, the fitness metric identifying at least one of a maximum channel load and a contention rate for each given configuration;
    determining whether stagnation has occurred in the population; and
    if stagnation has occurred, reporting a subset of the population based upon the fitness metric.

2. The method of claim 1, wherein if stagnation has not occurred, the method further comprises:
    selecting k solutions from the population having the lowest fitness metric; and
    merging the k solutions to form a new set of solutions.

3. The method of claim 2, further comprising:
    determining whether a maximum number of generations has been reached;
    if the maximum number of generations has been reached, reporting the subset of the population remaining in the merged solutions; and
    if the maximum number of generations has not been reached, mutating the new set of solutions to produce mutated solutions.

4. The method of claim 3, wherein mutating the new set of solutions includes swapping adjacent bits in the bit vector.

5. The method of claim 4, wherein mutating the new set of solutions further includes replacing existing ones of the new set of solutions with the mutated solutions.

6. The method of claim 3, further comprising re-evaluating the fitness metric for each memory controller configuration remaining in the merged solutions after mutation.

7. The method of claim 1, wherein the fitness metric is derived from a contention simulation, and the method further comprises simulating random permutation traffic for each memory controller configuration in the population.

8. The method of claim 1, wherein each bit vector is evaluated no more than once.

9. A method of selecting a memory controller configuration for a multiprocessor array, the method comprising:
- identifying a plurality of memory controller configurations of the multiprocessor array for testing;
- executing a link contention simulation trial on a first one of the memory controller configurations to trace a path that a memory packet takes through nodes in the multiprocessor array;
- incrementing a count on each link that the memory packet traverses, the count representing a channel load of the first memory controller configuration;
- repeating the link contention simulation trial until a maximum number of trials has been reached for the first memory controller configuration;
- averaging the channel loads for all trials to obtain a fitness metric for the first memory controller configuration;
- performing the executing, incrementing, repeating and averaging for each remaining memory controller configuration; and
- selecting a given one of the memory controller configurations having the lowest fitness metric.

10. The method of claim 9, further comprising evaluating a subset of the memory controller configurations by:
- representing each one of the subset of memory controller configurations by a bit vector of N*M Boolean elements;
- evaluating a fitness metric for each one of the subset of memory controller configurations, the fitness metric identifying at least one of a maximum channel load and a contention rate for each given configuration; and
- selecting one configuration from the subset of memory controller configurations based upon the fitness metric.

* * * * *